United States Patent
Edenfield et al.

(10) Patent No.: US 10,367,256 B2
(45) Date of Patent: Jul. 30, 2019

(54) ACTIVE ELECTRONICALLY STEERED ARRAY FOR SATELLITE COMMUNICATIONS

(71) Applicant: AvL Technologies, Inc., Asheville, NC (US)

(72) Inventors: Bryan Keith Edenfield, Weaverville, NC (US); Ian J. Timmins, Asheville, NC (US); Bruce Barratt, Asheville, NC (US); Adam Gropp, Raleigh, NC (US); Alan E. Ellis, Candler, NC (US); James L. Oliver, Asheville, NC (US)

(73) Assignee: AvL Technologies, Inc., Asheville, NC (US)

( * ) Notice: Subject to any disclaimer, the term of this patent is extended or adjusted under 35 U.S.C. 154(b) by 0 days.

(21) Appl. No.: 16/018,977

(22) Filed: Jun. 26, 2018

(65) Prior Publication Data

US 2019/0140362 A1 May 9, 2019

Related U.S. Application Data

(60) Provisional application No. 62/524,885, filed on Jun. 26, 2017.

(51) Int. Cl.
| | |
|---|---|
| *H01Q 1/28* | (2006.01) |
| *H01Q 21/06* | (2006.01) |
| *H01Q 3/26* | (2006.01) |
| *H01Q 3/30* | (2006.01) |
| *H01Q 3/34* | (2006.01) |

(Continued)

(52) U.S. Cl.
CPC ............ *H01Q 1/288* (2013.01); *H01Q 3/26* (2013.01); *H01Q 3/30* (2013.01); *H01Q 3/34* (2013.01); *H01Q 21/065* (2013.01); *H01Q 21/22* (2013.01); *H01Q 23/00* (2013.01)

(58) Field of Classification Search
CPC ............ H01Q 1/288; H01Q 3/34; H01Q 3/26; H01Q 3/30; H01Q 21/22; H01Q 21/065; H01Q 23/00
See application file for complete search history.

(56) References Cited

U.S. PATENT DOCUMENTS

| | | |
|---|---|---|
| 6,104,343 A | 8/2000 | Brookner et al. |
| 6,184,828 B1 | 2/2001 | Shoki |
| 6,336,259 B1 | 1/2002 | Stahlecker |

(Continued)

*Primary Examiner* — Daniel D Chang
(74) *Attorney, Agent, or Firm* — The Van Winkle Law Firm; William G. Heedy

(57) ABSTRACT

An AESA for SATCOM includes a PCB; a plurality of ICs; an RF feed network for an array; a plurality of patch antennas; a SPI bus for controlling phase shifting of the ICs; phase shifters being operable for selectively introducing a phase shift internal to each of the plurality of ICs such that the radiation pattern resulting from the patch antennas connected to a single IC are steered; a RF power amplifier in each of the ICs, the RF power amplifier being in a common IC footprint with at least one of the phase shifters; the RF power amplifier being structured and disposed for providing amplification for the array, wherein the RF power amplifier compensates for the lossy nature of the internal layers of the PCB; and wherein the plurality of ICs to selectively provide either left hand circular polarization, right hand circular polarization, horizontal polarization or vertical polarization.

14 Claims, 14 Drawing Sheets

(51) Int. Cl.
*H01Q 21/22* (2006.01)
*H01Q 23/00* (2006.01)

(56) References Cited

U.S. PATENT DOCUMENTS

| | | |
|---|---|---|
| 6,492,942 B1 | 12/2002 | Kezys |
| 6,977,621 B2 | 12/2005 | Kelly et al. |
| 7,391,381 B2 | 6/2008 | Wang et al. |
| 7,532,171 B2 | 5/2009 | Chandler |
| 7,808,439 B2 | 10/2010 | Yang et al. |
| 8,279,131 B2 | 10/2012 | Puzella et al. |
| 9,112,262 B2 | 8/2015 | Warnick et al. |
| 9,192,047 B2 | 11/2015 | Tevell et al. |
| 9,413,051 B2 | 8/2016 | Milroy et al. |
| 9,692,125 B1 | 6/2017 | Channabasappa et al. |
| 9,713,155 B2 | 7/2017 | Negus |
| 9,900,065 B2 | 2/2018 | Trotta |
| 9,948,260 B1 | 4/2018 | Gharavi et al. |
| 2015/0222021 A1 | 8/2015 | Stevenson et al. |
| 2016/0261043 A1 | 9/2016 | Sazegar et al. |
| 2017/0085006 A1* | 3/2017 | Corman .................. H01Q 3/26 |
| 2017/0187101 A1 | 6/2017 | Freeman et al. |
| 2018/0054005 A1* | 2/2018 | Jain .......................... H01Q 5/30 |
| 2018/0076521 A1 | 3/2018 | Mehdipour et al. |
| 2018/0175476 A1* | 6/2018 | Teshiba ................. H01Q 23/00 |
| 2018/0287266 A1* | 10/2018 | Madsen ............. H01L 23/4952 |
| 2019/0044251 A1* | 2/2019 | McMorrow ........... H01Q 21/22 |

\* cited by examiner

ACTIVE ELECTRONICALLY STEERED ARRAY FOR SATELLITE COMMUNICATIONS

RELATED APPLICATION

This application claims priority to and incorporates entirely by reference U.S. Provisional Patent Application Ser. No. 62/524,885 filed on Jun. 26, 2017.

FIELD OF THE INVENTION

This invention relates to systems that may be deployed as a ground terminal by flyaway or manpack form factors as well as mounted on a vehicle (ground, marine or aircraft) for satellite communications on the move.

BACKGROUND OF THE INVENTION

Array antennas are used extensively in remote applications wherein a narrow beam is needed to scan a particular area of interest. The development of an Active Electronically Steered Array ("AESA") requires unique subsystem development to be suitable for satellite communications. An AESA is generally developed for the purpose of satellite communications by placing a large number of ASICs (applications specific integrated circuits) that provide electronic beamforming on a printed circuit board (PCB) to form an antenna aperture.

Such a PCB includes several subsystems that must be developed to support a cell form factor that contains the above-mentioned ASIC in combination with printed antennas, RF feed networks to support RF power divider/combiner functions, DC power and a data bus to program and control the individual ICs.

There exists a need for an IC based AESA for satellite communications wherein phase shifting is conducted in the IC for selectively introducing a time delay for the purposes of phase adjustment for scanning angle and phase adjustment for creating lefthanded, righthanded circular polarization as well as linear polarization. The AESA may be used on combination with a mechanical positioner system in a similar manner that a parabolic reflector is positioned. Moreover, multiple AESAs may be used at different locations, such as on the sides of a vehicle, or in a form factor such as a circle whereby the RF input/outputs of the feed network can be combined to take advantage of the increased size of the overall form factor, or to improve scanning visibility of the AESA.

SUMMARY OF THE INVENTION

In accordance with one form of the present invention, there is provided an active electronically steered array for satellite communications including a printed circuit board (PCB) including a first side and a second side surrounding a plurality of internal layers; a plurality of integrated circuits (ICs) on the first side of the PCB, the plurality of ICs being structured and disposed for controlling beam steering of an array; an RF feed network for the array, the RF feed network being embedded on one of the plurality of internal layers of the PCB, the RF feed network being structured and disposed for connecting the plurality of ICs such that each of the plurality of ICs is fed with a common signal that is distributed to the plurality of ICs; a plurality of patch antennas on the second side of the PCB, each of the plurality of patch antennas being fed by a corresponding one of the plurality of ICs; a serial peripheral interface (SPI) bus being structured and disposed for controlling phase shifting of at least one of the plurality of ICs; a plurality of phase shifters being operable for selectively introducing a phase shift internal to each of the plurality of ICs such that a radiation pattern resulting from a collective of the plurality of patch antennas is steered; at least one sensor for gathering sensor data; a controller in communication with the at least one sensor and the plurality of ICs, wherein the controller receives the sensor data from the at least one sensor and delivers a signal to the plurality of ICs for controlling beam steering of the array in response to the sensor data; a radio frequency (RF) power amplifier in each of the plurality of ICs, the RF power amplifier being in a common IC footprint with at least one of the plurality of phase shifters and being operable by the controller through the SPI bus; the RF power amplifier being structured and disposed for providing amplification for the array, wherein the RF power amplifier compensates for the lossy nature of the internal layers of the PCB; and wherein the plurality of ICs is operable by the controller through the SPI bus to selectively provide either left hand circular polarization, right hand circular polarization, horizontal polarization or vertical polarization.

In accordance with another form of the present invention, there is provided an antenna system including a printed circuit board (PCB) stackup including a first radiating layer defined by a plurality of patch antennas; a second radiating layer defined by a plurality of parasitic patch antennas employed to enhance the bandwidth of the plurality of patch antennas; a first RF ground layer defining one of a plurality of internal layers of the PCB, the first RF ground layer being located adjacent the plurality of patch antennas; a serial peripheral interface (SPI) bus layer defining one of the plurality of internal layers, the SPI bus being structured and disposed for controlling phase shifting of at least one of a plurality of ICs; a digital ground layer defining one of the plurality of internal layers; a VCC layer defining one of the plurality of internal layers, the VCC layer being structured and disposed for providing power to the plurality of ICs; an RF feed layer defining one of the plurality of internal layers being structured and disposed for connecting the plurality of ICs such that each of the plurality of ICs is fed with a common signal that is distributed to the plurality of ICs; a second RF ground layer defining one of the plurality of internal layers; a plurality of short feed networks located between the plurality of patch antennas and a corresponding one of the plurality of ICs for feeding vertical and horizontal polarity to each of the plurality of patch antennas; and a plurality of phase shifters in communication with the SPI bus, the plurality of phase shifters being structured and disposed for producing an appropriate phase shift in each of the plurality of short feed networks to the plurality of patch antennas for the purpose of steering the beam produced by the plurality of ICs and to selectively provide either left hand circular polarization, right hand circular polarization, horizontal polarization or vertical polarization.

BRIEF DESCRIPTION OF THE DRAWINGS

For a fuller understanding of the nature of the present invention, reference should be made to the following detailed description, taken in conjunction with the accompanying drawings in which.

Like reference numerals refer to like parts throughout the several views of the drawings.

DETAILED DESCRIPTION OF THE PREFERRED EMBODIMENTS

Referring to the several views of the drawings, the IC based Active Electronically Steered Array ("AESA") of the present invention is shown and is generally indicated as 10. The AESA is configured for use in combination with satellite systems.

Figure 1:
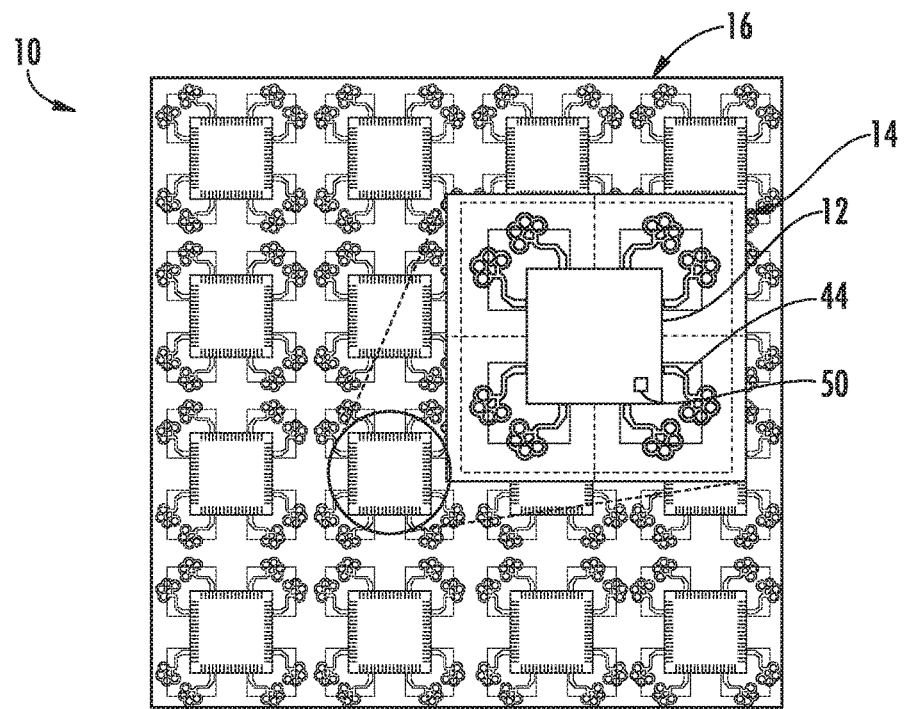
FIG. 1 is a diagram of the circuit board including a plurality of integrated circuits.
Figure 2:
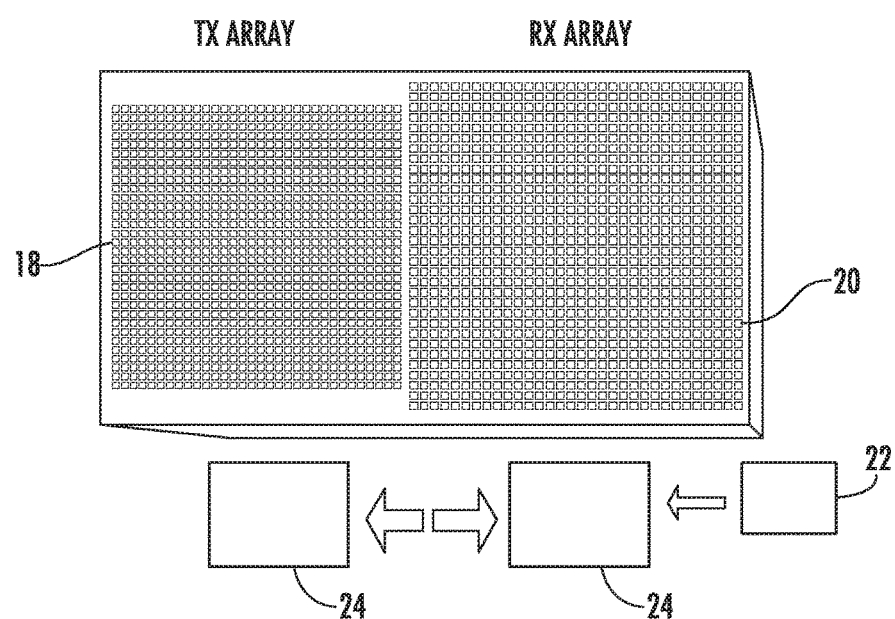
FIG. 2 is a diagram illustrating the TX and RX arrays opposite one of the integrated circuits on the circuit board.

Referring initially to FIGS. 1 and 2, the AESA 10 includes an integrated circuit (IC) or a plurality of ICs 12 for providing beamforming functionality using multiple patch antennas 14 that collectively form a unit cell that may be repeatedly placed on a circuit board 16 to create an antenna aperture. This common plane of multiple ICs 12 creates a foundation to electronically form a beam that is of a suitably narrow radiation pattern for satellite communications applications. These ICs 12 are connected to the patch antennas 14 on the opposite side of the circuit board 16. The ICs 12 may be programmed individually to provide various radiation patterns to produce a collective radiation pattern suitable for satellite communications.

Referring specifically to FIG. 2, the opposite side of the circuit board 16 includes TX and RX arrays 18 and 20. In one embodiment, the TX and RX arrays 18 and 20 are structured such that the radiation patterns on the TX and RX rely on one or more sensors 22 to steer the patch antennas to the appropriate direction. These collective inputs from the sensors 22 may be used to optimize the TX and RX radiation patterns from controllers 24, including from either discrete FPGA controllers 24 for each TX and RX array 18 and 20 or multiple FPGAs 24 controlling the TX and RX functions collectively and sharing relevant information over a data bus. The controllers 24 may as be microcontrollers or application-specific integrated circuit (ASICs). The sensors 22 include, but are not limited to, GPS sensors, tilt sensors, resolver sensors and magnetic compass sensors, which collectively help orientate the physical position or location of both arrays 18 and 20 or provide some measure of received signal strength either from the satellite to the RX array 20, or the signal strength transmitted to the satellite from the TX array 18.

Figure 3:
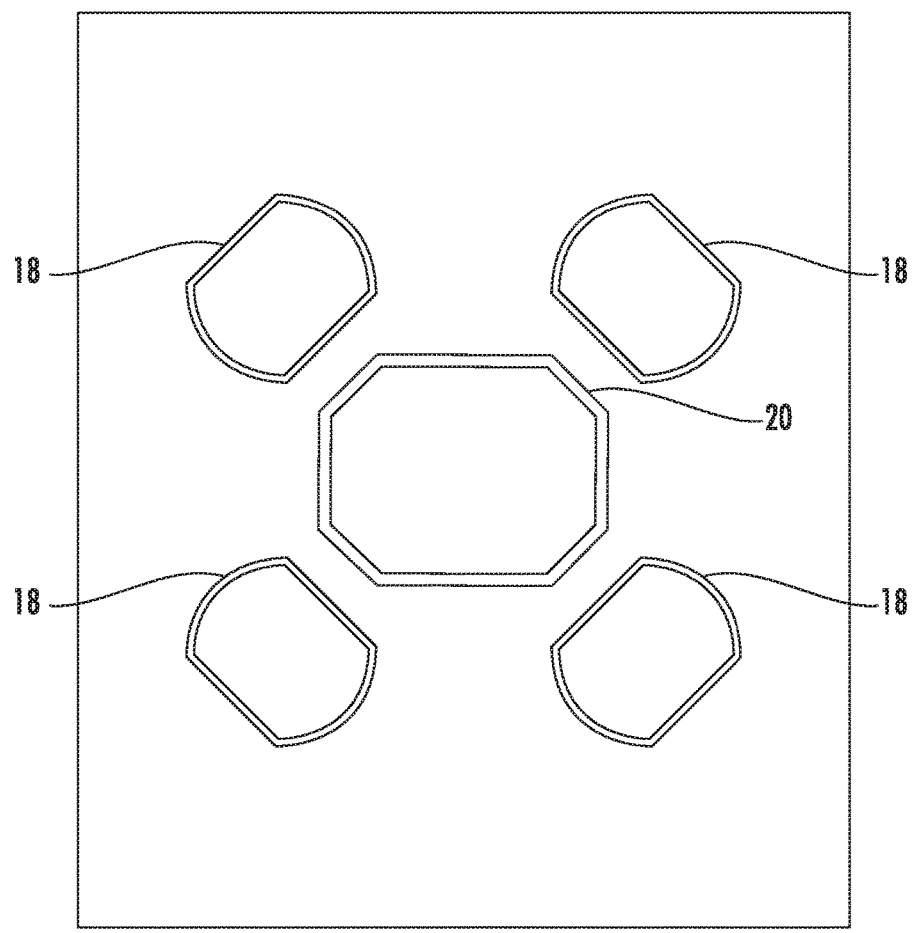
FIG. 3 is a diagram illustrating interleaved TX and RX arrays.

Referring to FIG. 3, in accordance with one embodiment, the TX and RX arrays 18 and 20 are interleaved to increase the surface area of each of the TX and RX arrays 18 and 20 for the purposes of narrowing the respective beams.

Figure 4:
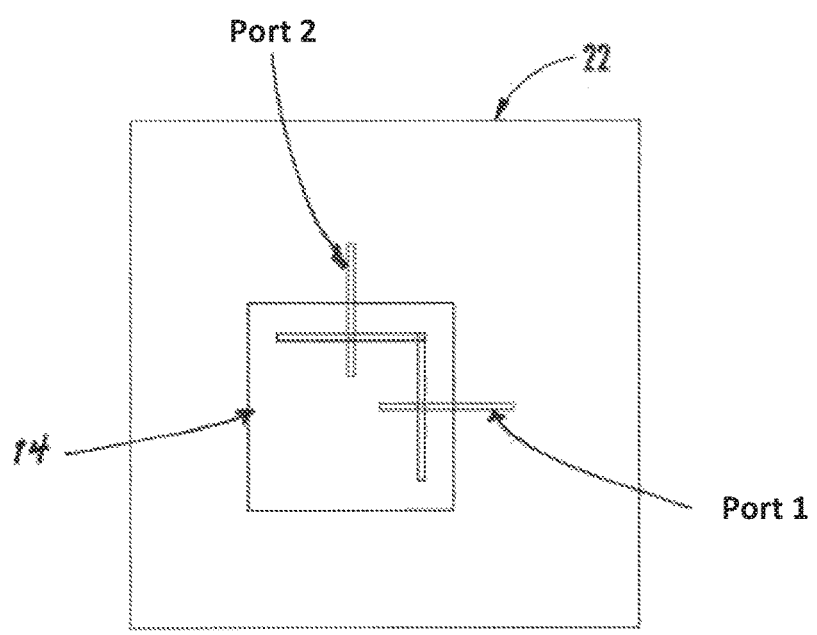
FIG. 4 is a diagram illustrating a printed antenna on a PCB substrate.

A printed antenna on a PCB substrate 22 is illustrated in FIG. 4, showing Port 1 and Port 2 aperture-coupled to a patch antenna 14 as a feeding mechanism between the IC and the patches. To produce an antenna 14 that radiates in circular polarization, including left hand circular polarization, right hand circular polarization, horizontal polarization or vertical polarization, a hybrid coupler may be employed. In order to maintain the overall footprint of the structure such that it is employable by the ICs 12 as described above, the hybrid coupler would have to be folded back under the printed antenna on different PCB layers and contained within the printed circuit patch. While FIG. 4 illustrates a single patch, printed antennas 14 can be stacked in the unit cell to create more bandwidth for an IC 12 that supports only a TX function, or to create printed antennas for both TX and RX functions in an IC that contains both transmit and receive functions. Using ICs 12 that provide a single TX or RX function would require two distinct AESAs 10, whereas an IC 12 with both TX and RX functions in a single cell creates a common aperture where both transmit and receive antennas are contained on different layers of the circuit board 16 pattern that is repeated to create the overall arrays.

Different dielectric materials may be employed for the PCB stackup 26, whereby lower dielectric materials are used for the radiating patches or, in one embodiment, air-filled cavities surrounded by metal walls within the stackup 26 to increase bandwidth of printed antennas. Higher dielectric constant materials may be used on feed layers where the feed hybrid coupler circuits are contained to give an increased electrical length of the RF circuits, making them physically smaller and more easily placed within the boundaries of the patch antenna unit cells and then repeatedly placed on the PCB structure to create an array using multiple beamforming ICs 12.

The increased number of embedded layers function both as grounding layers for RF and digital circuits, but also contain vias that support thermal transfer between the ICs 12 to enhance heat dissipation of the ICs 12 into the copper layers as a method to control the thermal properties of the AESA 10. A waveguide manifold used to distribute RF signal to localized sub sections of the PCB may also be employed to act as a heat sink to alleviate thermal energy generated by the ICs 12.

Figure 5:
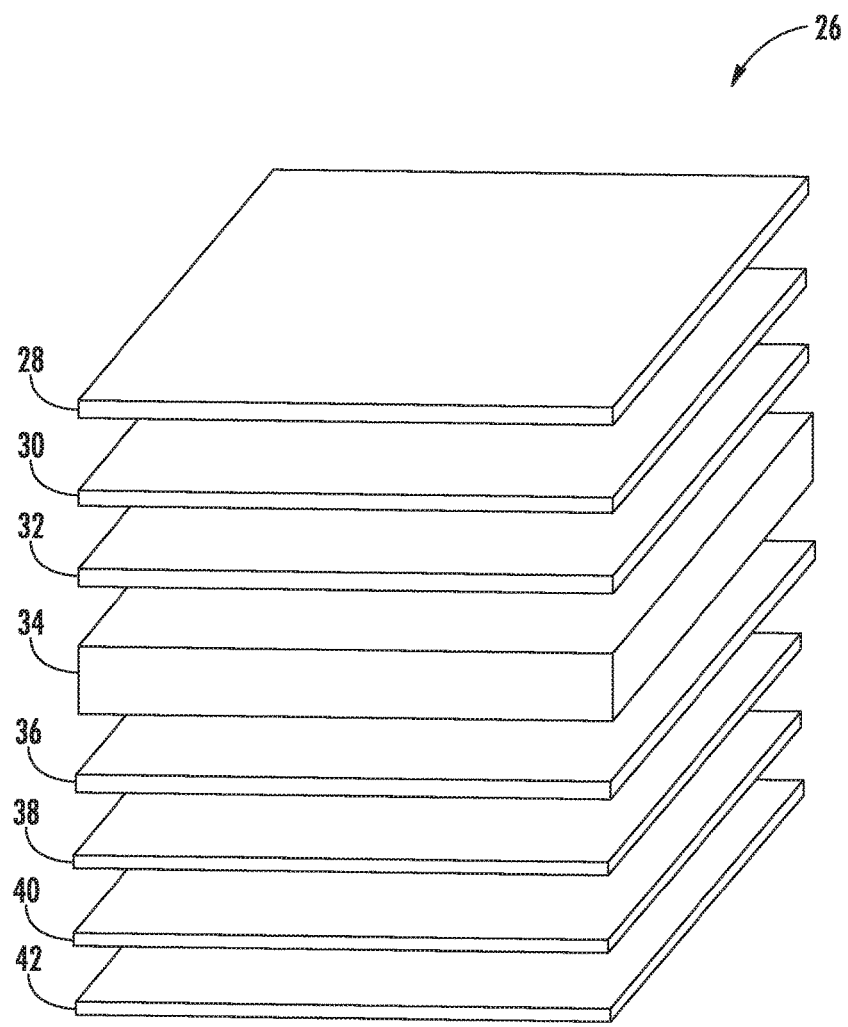
FIG. 5 is a diagram illustrating a printed circuit board stackup.

Referring to FIG. 5, the PCB stackup 26 includes a first radiating layer 28 defined by a plurality of patch antennas 14 and a second radiating layer 30 defined by a plurality of parasitic patch antennas employed to enhance the bandwidth of the plurality of patch antennas 14. A first RF ground layer 32 defines one of a plurality of internal layers of the PCB stackup 26, the first RF ground layer 32 being located adjacent the plurality of patch antennas 14. A serial peripheral interface (SPI) bus layer 34 defines one of the plurality of internal layers and is structured and disposed for controlling phase shifting of at least one of the ICs 12. A digital ground layer 36 defines one of the plurality of internal layers. A VCC layer 38 defines one of the plurality of internal layers and is structured and disposed for providing power to the plurality of ICs 12. An RF feed layer 40 defines one of the plurality of internal layers and is structured and disposed for connecting the plurality of ICs 12 such that each of the plurality of ICs 12 is fed with a common signal that is distributed to the plurality of ICs 12. A second RF ground layer 42 defines one of the plurality of internal layers.

A plurality of short feed networks 44 located between the plurality of patch antennas 14 and a corresponding one of the plurality of ICs 12 is provided for feeding vertical and horizontal polarity to each of the plurality of patch antennas 14. A plurality of phase shifters 46 in communication with the SPI bus 34 are structured and disposed for producing an appropriate phase shift in each of the plurality of short feed networks 44 to the plurality of patch antennas 14 for the purpose of steering the beam produced by the plurality of ICs 12 and to selectively provide either left hand circular polarization, right hand circular polarization, horizontal polarization or vertical polarization.

Figure 6:
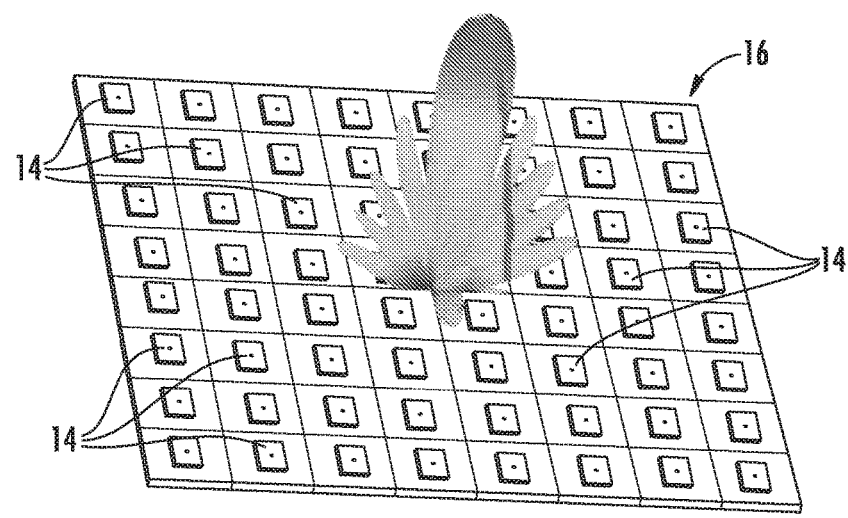
FIG. 6 illustrates an antenna array with patch antennas having a radiation pattern steered forward from the PCB plane.

Now referring to FIG. 6, the antenna array is shown with the patch antennas 14 forming a radiation pattern steered directly forward from the circuit board 16. In this case, the beam is showing maximum gain at boresight, which is normal to the physical antenna flat plate form factor. As the beam is steered away from this boresight position, gain decreases to where, at 60-degrees from normal, it is deemed insufficient to support a communication link. This radiation pattern can be steered to different positions in the xy coordinate system by programming the ICs 12.

Figure 7:
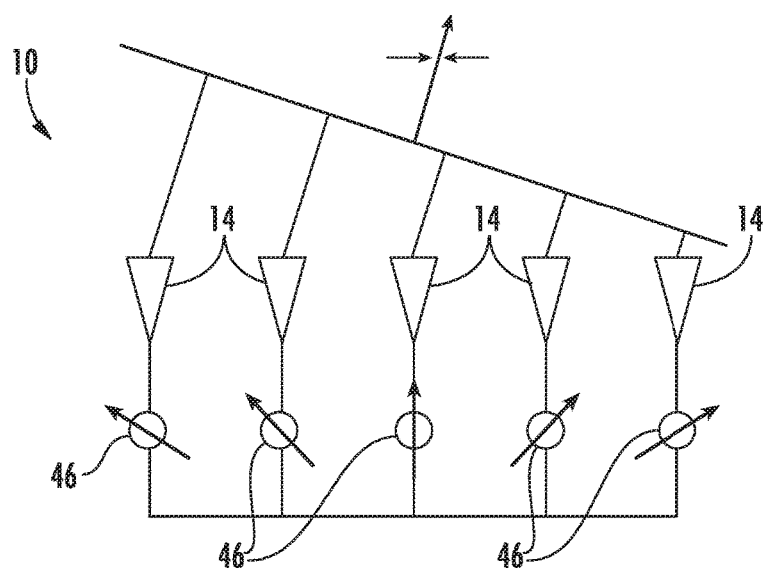
FIG. 7 is a diagram illustrating phase shifters in combination with the printed patch antennas.
Figure 8:
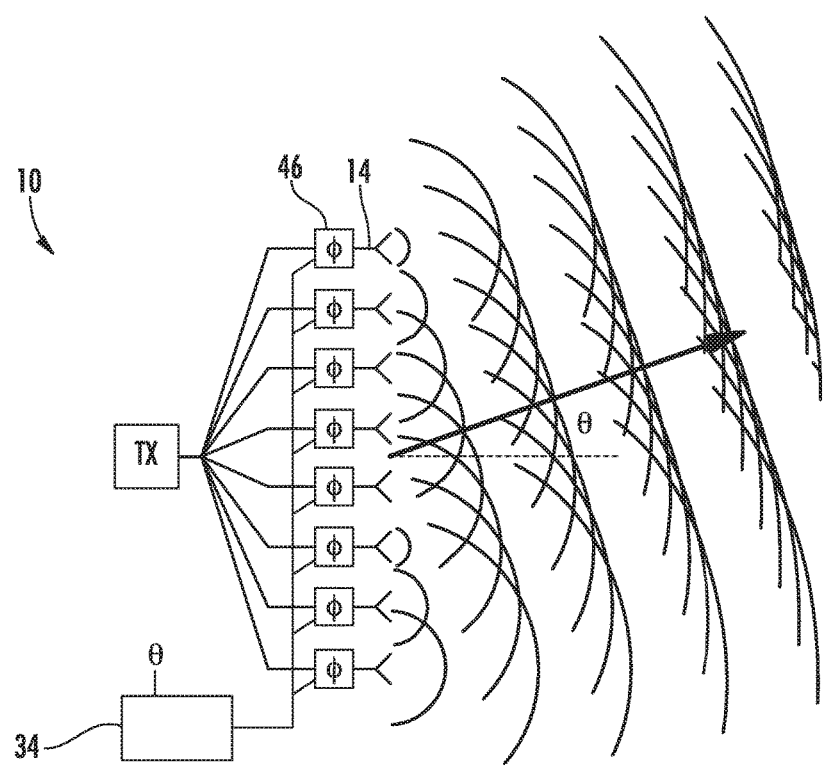
FIG. 8 is a diagram illustrating phase adjustment of the array.
Figure 9:
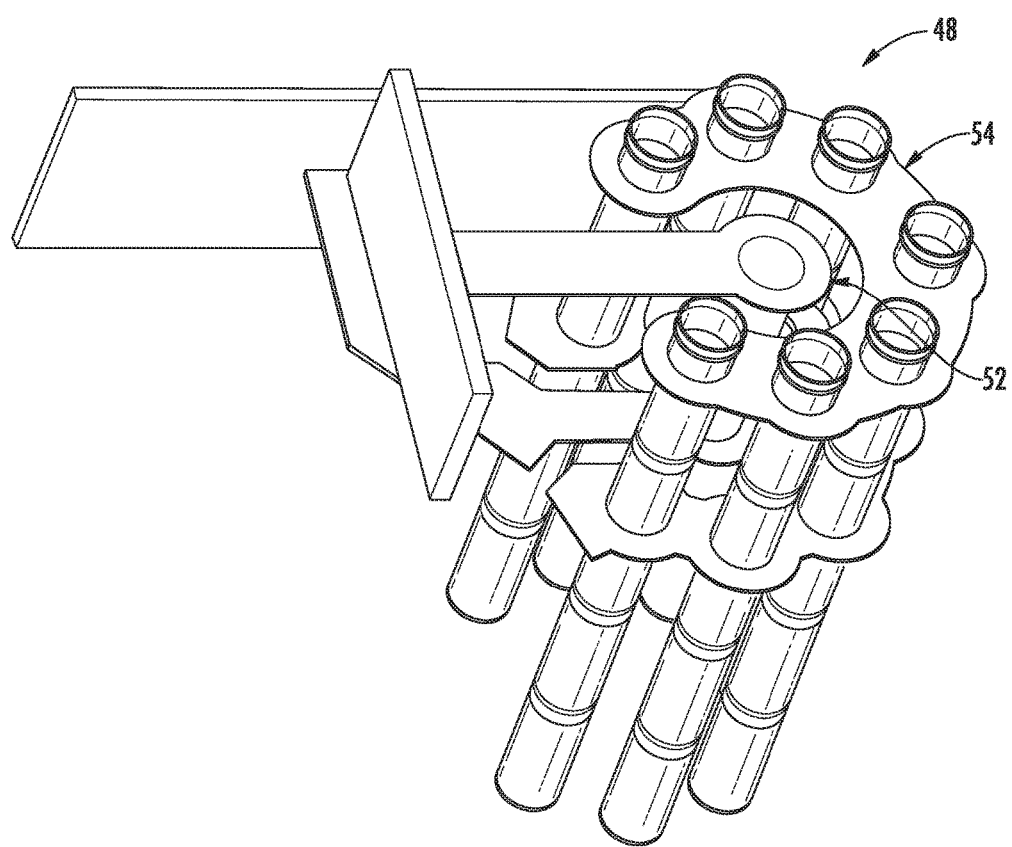
FIG. 9 is an isolated perspective view illustrating a printed circuit via structure.
Figure 10:
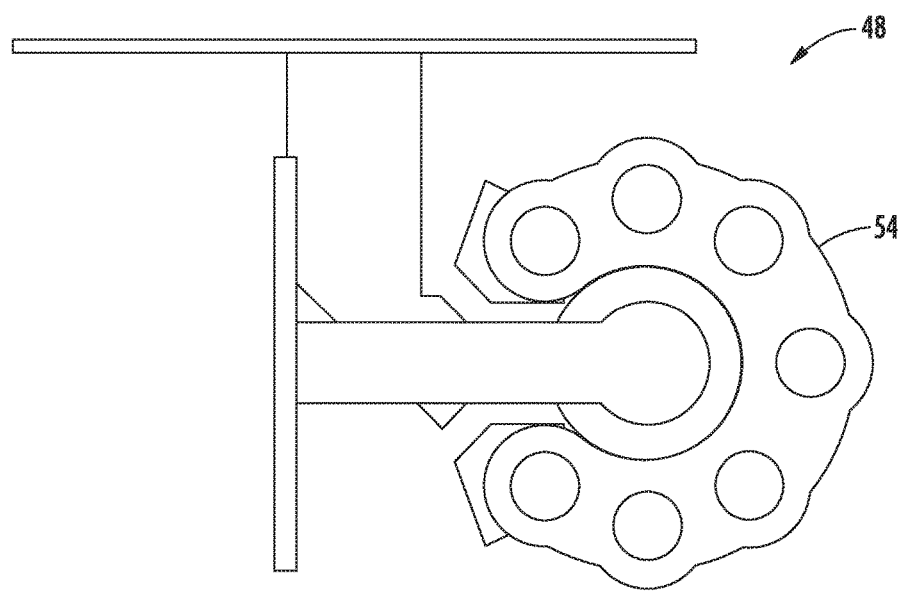
FIG. 10 is an isolated top plan view illustrating the printed circuit via structure.

Referring to FIGS. 7 and 8, the phased array antenna architecture is shown, wherein the printed patch antennas 14 can adjust the scan angle of the array by introducing time delay in the RF feed network 40 through the use of phase shifters 46. In this case, this phase shifting is conducted in the ICs 12, whereby the phase shift is programmed through a SPI bus 34 digitally. The SPI bus 34 connects the appropriate signals to the controller 24 to program a corresponding one of the ICs 12 using either a single or multiple implementation of SPI buses 32 such that ICs 12 can be programmed serially or subsets of the ICs 12 can be programmed in parallel. By adjusting the phase ($\phi$) from a common transmitter 34 through the feed network 40, the array can be steered to the direction of receiver at theta ($\theta$). The RF feed network 40 distributes to each of the plurality of ICs 12 at equal magnitude and phase from a common TX/RX input.

A considerable difficulty concerning printed antennas is the losses that occur in the circuit board 16 reduce overall gain of the antenna. Referring to FIGS. 9-14, the printed circuit via structure 48 of RF feed network 40 illustrates how the layers of the circuit board 16 are connected. The ICs 12 contain a power amplifier 50 in addition to its functionality as a phase shift. The phase shift is programmed to steer the direction of the beam digitally, but the IC 12 is also employed as a gain block to control power amplification that compensates for signal loss in the RF feed network 40 of the circuit board 16 that is typical of high frequency PCB materials.

Figure 11:
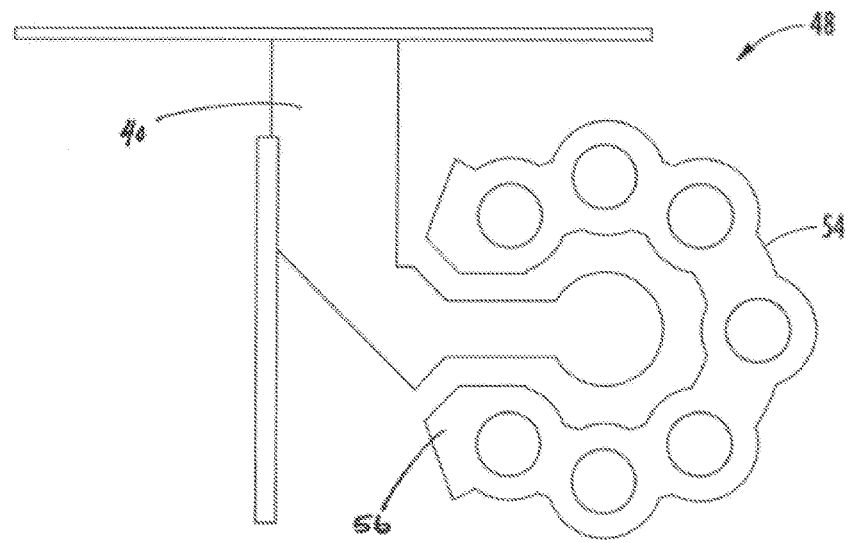
FIG. 11 is an isolated top plan view illustrating the RF feed network printed circuit pattern.
Figure 12:
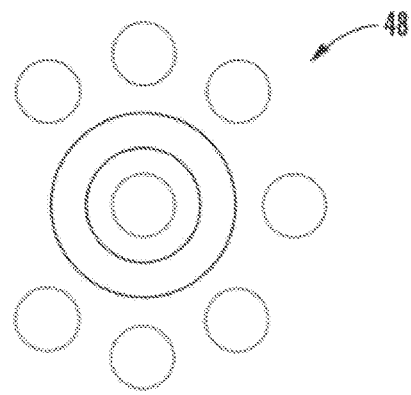
FIG. 12 is an isolated top plan view illustrating the ground plane of the printed circuit structure.
Figure 13:
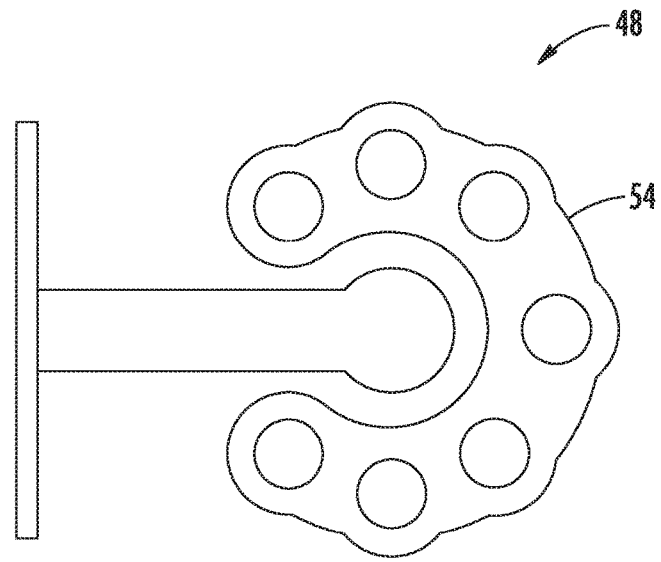
FIG. 13 is an isolated top plan view illustrating the collar surrounding the signal via structure.
Figure 14:
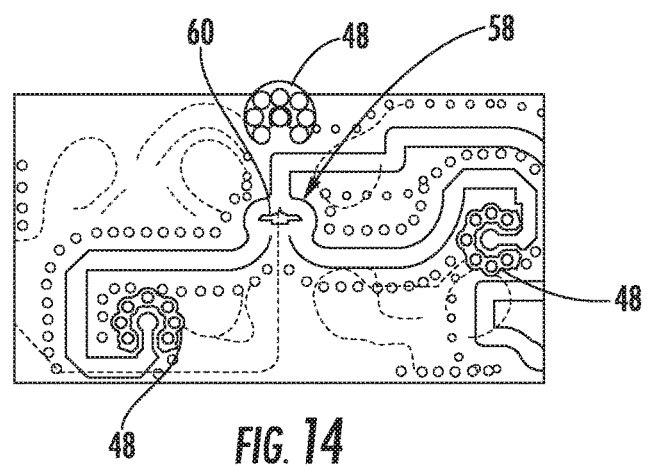
FIG. 14 is a diagram illustrating an isolated view of the circuit board layout.

The printed circuit via structure 48 includes lower and upper RF feed layers. A signal via 52 located at the center of the structure 48 connects the lower and upper RF feed layers. Ground posts of the via are on the collar 54 around the perimeter. The ground plane allows the signal to propagate with reduced loss between the layers. Referring specifically to FIG. 11, the collar 54 helps with impedance matching and the trace length increases in width as it moves right to left. The nose 56 is tapered and held in close form to the trace as it increases in width to maintain low loss transmission from one layer to another. The ground plane (negative, as shown in FIG. 12) is between the signal traces of the lower and upper RF feed layers. Referring to FIG. 14, the vias are shown in connection with a plurality of power dividers 58 and resistive foils 60. The power dividers 58 are used with increased isolation between output ports to improve the fidelity of the signal received from the collective of ICs 12 during beam steering. In one embodiment, as shown, the power dividers 58 are Wilkinson power dividers with resistive foil 60 employed for this purpose.

Figure 15:
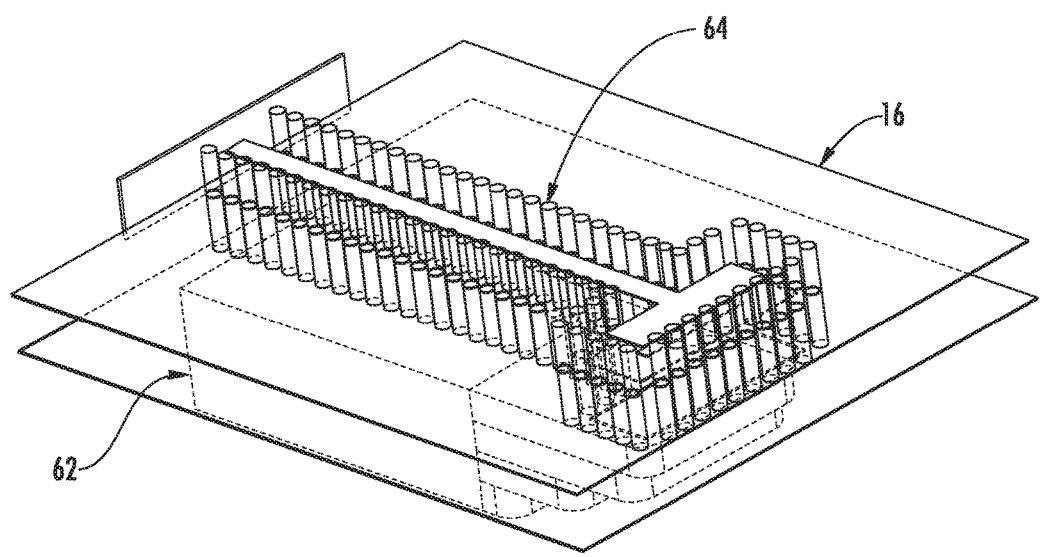
FIG. 15 is a perspective view illustrating the circuit board and waveguide structure.
Figure 16:
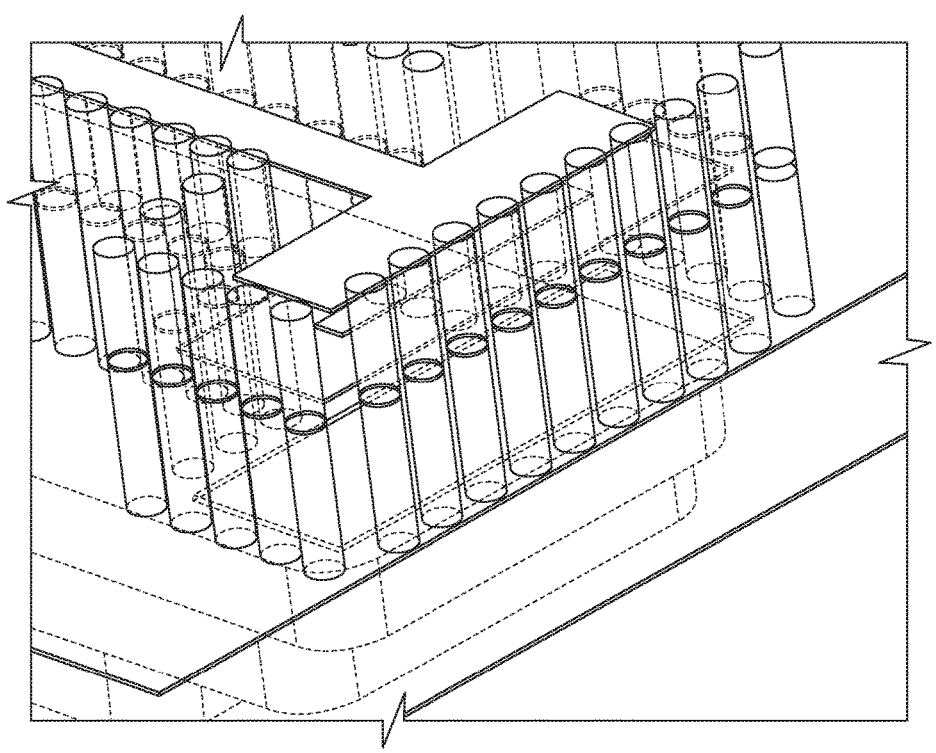
FIG. 16 is an isolated view taken from FIG. 14.
Figure 17:
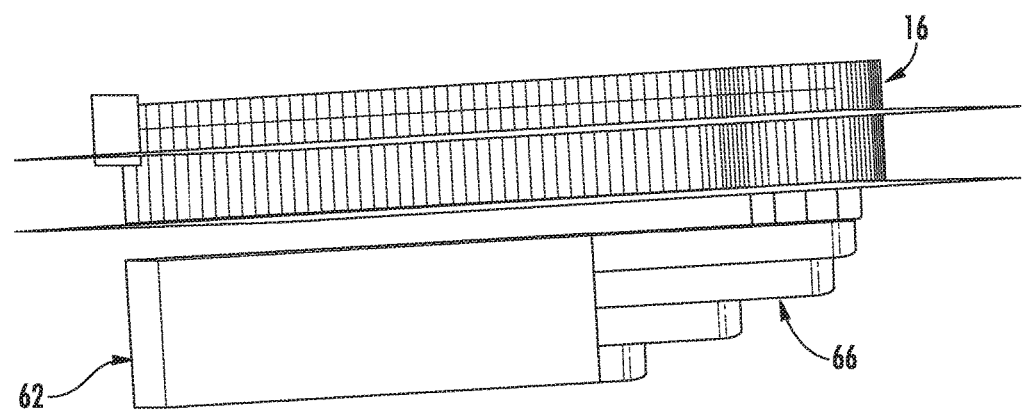
FIG. 17 is a side elevational view illustrating the circuit board and waveguide structure.

Referring to FIGS. 15-17, the waveguide 62 to circuit board 16 transition allows for minimum signal loss in moving from waveguide to stripline. Via pins 64 create a waveguide-like structure in vertical form inside the circuit board 16. The waveguide manifold 62 located below the PCB provides a low loss mechanism to distribute RF energy to and from localized regions of the AESA array. The waveguide 62 approaches the PCB with a transmission line that is parallel to the feed networks in the PCB. Prior to entering the PCB, the waveguide manifold 26 employees and 'E-bend' 66 which matches impedance as the transmission line changes orientation from running horizontally to vertically to match RF transmission as it enters the PCB structure. At this point, on the bottom layer of the PCB, a ground plane is located acting as a lower reference for the RF feed network, which is a stripline structure. A void in the ground plane is created, whereby a parasitic element in the form of a smaller rectangle is used as an impedance matching element of the circuit. The vertical vias, connected to the ground planes located within PCB, act as guide to transmission in a direction that is now perpendicular to the original waveguide manifold. If there are multiple ground planes to be passed through, multiple voids and parasitic elements can be used to minimize loss of the RF signal propagate in the vertical direction. At the point where the energy must transition to a stripline form for the feed network, a wide patch element is used that is embedded in the PCB, on the same layer as the stripline feed network. This patch structure acts as an intermediate structure to allow low loss transmission from the vertical vias component of the structure to the convention stripline feed network that will deliver RF energy to or from the TX or RX patches respectively. It is also required when vias are used to cross multiple stripline structures when travelling vertically inside a PCB, that vias must be used to complete the outer perimeter over the layer to prevent RF energy from propagating onto the in correct later, which would increase loss. These vias are typically located in the region below the target stripline trace at the point it becomes a stripline transmission line.

The properties of a flat panel antenna array have limited ability to steer the beam. Therefore, in some cases it is desirable to augment the electronically steered ability of the flat panel antenna with that of a mechanical positioner, which can adjust the normal direction of the flat panel array in the same way it positions a parabolic reflector whereby macro level movements can be conducted by the mechanical positioner and refining movements can be by electronic steering. The use of the AESA 10 in combination with the mechanical positioner could be used to reduce physical wear and mechanical components that otherwise would be in constant motion.

Figure 18:
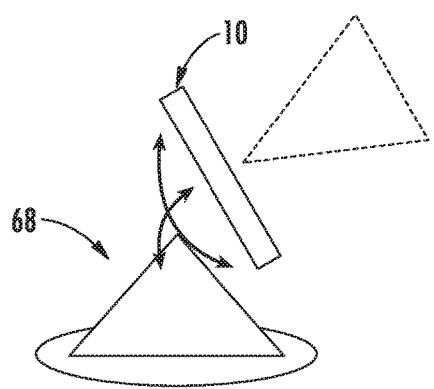
FIG. 18 is a diagram illustrating use of a mechanical positioner in combination with the AESA.

Referring to FIG. 18, a mechanical positioner 68 can be combined with an AESA to improve the ability of the antenna to be pointed. In this case, the AESA 10 provides the micro level movements of the steered beam while the macro level movements are provided by the mechanical positioner 68. The hybrid antenna thus provides an increase in the field of view for the AESA 10 and minimizes the mechanical wear and tear on components that would be in constant motion for the application of a fixed beam system. The controller 24 of the AESA 10 and the mechanical positioner 68 are in communication, which helps in setting the threshold of motion depending on the level of signal received at the AESA 10. In other words, mechanical motion may be increased to maintain a minimum level of signal received by the AESA 10, and motion ceased if the signal strength is not required to ease strain on the mechanical components of the positioner 68. In some cases, multiple AESAs 10 may be combined to increase the field of view and provide beam steering that is done individually. Moreover, multiple AESAs 10 at various locations and orientations may be combined using a common switching circuit that collects the RF output from each individual AESA 10, and then provides a common output. The single RF output may be based on the output from the most appropriate single AESA 10 in the distributed antenna or it may by the collective RF output from individual antennas together.

While the present invention has been shown and described in accordance with several preferred and practical embodiments, it is recognized that departures from the instant disclosure are contemplated within the spirit and scope of the present invention.

What is claimed is:

1. An active electronically steered array for satellite communications, the active electronically steered array comprising:
    a printed circuit board (PCB) including a first side and a second side surrounding a plurality of internal layers;
    a plurality of integrated circuits (ICs) on the first side of the PCB, the plurality of ICs being structured and disposed for controlling beam steering of an array;
    an RF feed network for the array, the RF feed network being embedded on one of the plurality of internal layers of the PCB, the RF feed network being structured and disposed for connecting the plurality of ICs such that each of the plurality of ICs is fed with a common signal that is distributed to the plurality of ICs;
    a plurality of patch antennas on the second side of the PCB, each of the plurality of patch antennas being fed by a corresponding one of the plurality of ICs;
    a serial peripheral interface (SPI) bus being structured and disposed for controlling phase shifting of at least one of the plurality of ICs;
    a plurality of phase shifters being operable for selectively introducing a phase shift internal to each of the plurality of ICs such that a radiation pattern resulting from a collective of the plurality of patch antennas is steered;
    at least one sensor for gathering sensor data;
    a controller in communication with the at least one sensor and the plurality of ICs, wherein the controller receives the sensor data from the at least one sensor and delivers a signal to the plurality of ICs for controlling beam steering of the array in response to the sensor data;
    a radio frequency (RF) power amplifier in each of the plurality of ICs, the RF power amplifier being in a common IC footprint with at least one of the plurality of phase shifters and being operable by the controller through the SPI bus;
    the RF power amplifier being structured and disposed for providing amplification for the array, wherein the RF power amplifier compensates for the lossy nature of the internal layers of the PCB; and
    wherein the plurality of ICs is operable by the controller through the SPI bus to selectively provide either left hand circular polarization, right hand circular polarization, horizontal polarization or vertical polarization.

2. The active electronically steered array for satellite communications as recited in claim 1 wherein the array is a TX array embedded on one of the plurality of internal layers of the PCB.

3. The active electronically steered array for satellite communications as recited in claim 1 wherein the array is an RX array embedded on an internal layer of the PCB.

4. The active electronically steered array for satellite communications as recited in claim 1 wherein the array includes a TX array and an RX array and the plurality of integrated circuits (ICs) are structured and disposed for controlling beam steering of each of the TX and RX arrays.

5. The active electronically steered array for satellite communications as recited in claim 1 further comprising a plurality of SPI buses each being structured and disposed for controlling phase shifting of at least one of the plurality of ICs.

6. The active electronically steered array for satellite communications as recited in claim 1 further comprising a plurality of SPI buses each being structured and disposed for controlling different subsections of at least one of the plurality of ICs in parallel.

7. The active electronically steered array for satellite communications as recited in claim 1 wherein the controller is a field-programmable gate array (FPGA).

8. The active electronically steered array for satellite communications as recited in claim 1 wherein the controller is a microcontroller.

9. The active electronically steered array for satellite communications as recited in claim 1 wherein the controller is an application-specific integrated circuit (ASIC).

10. The active electronically steered array for satellite communications as recited in claim 1 wherein the array includes a TX array and an RX array and the controller is programmable for controlling beam steering of the TX array and RX array in response to the sensor data.

11. The active electronically steered array for satellite communications as recited in claim 1 wherein the array includes interleaved TX and RX arrays.

12. The active electronically steered array for satellite communications as recited in claim 1 wherein the RF feed network further comprises a plurality of power dividers that are structured and disposed for improving the fidelity of the signal received from the plurality of ICs during beam steering.

13. The active electronically steered array for satellite communications as recited in claim 12 wherein the plurality of power dividers comprises a plurality of Wilkinson power dividers with resistive foil.

14. An antenna system including a printed circuit board (PCB) stackup comprising:
    a first radiating layer defined by a plurality of patch antennas;
    a second radiating layer defined by a plurality of parasitic patch antennas employed to enhance the bandwidth of the plurality of patch antennas;
    a first RF ground layer defining one of a plurality of internal layers of the PCB, the first RF ground layer being located adjacent the plurality of patch antennas;

a serial peripheral interface (SPI) bus layer defining one of the plurality of internal layers, the SPI bus being structured and disposed for controlling phase shifting of at least one of the plurality of ICs;

a digital ground layer defining one of the plurality of internal layers;

a VCC layer defining one of the plurality of internal layers, the VCC layer being structured and disposed for providing power to the plurality of ICs;

an RF feed layer defining one of the plurality of internal layers being structured and disposed for connecting the plurality of ICs such that each of the plurality of ICs is fed with a common signal that is distributed to the plurality of ICs;

a second RF ground layer defining one of the plurality of internal layers;

a plurality of short feed networks located between the plurality of patch antennas and a corresponding one of the plurality of ICs for feeding vertical and horizontal polarity to each of the plurality of patch antennas; and a plurality of phase shifters in communication with the SPI bus, the plurality of phase shifters being structured and disposed for producing an appropriate phase shift in each of the plurality of short feed networks to the plurality of patch antennas for the purpose of steering the beam produced by the plurality of ICs and to selectively provide either left hand circular polarization, right hand circular polarization, horizontal polarization or vertical polarization.

* * * * *